United States Patent
Lee et al.

(10) Patent No.: US 11,169,442 B2
(45) Date of Patent: Nov. 9, 2021

(54) EUV DEVELOPER COMPOSITION FOR FORMING PHOTOSENSITIVE PHOTORESIST MICROPATTERN

(71) Applicant: YOUNG CHANG CHEMICAL CO., LTD, Gyeongsangbuk-do (KR)

(72) Inventors: Su Jin Lee, Daegu (KR); Gi Hong Kim, Daegu (KR); Seung Hun Lee, Daegu (KR); Seung Hyun Lee, Daegu (KR)

(73) Assignee: YOUNG CHANG CHEMICAL CO., LTD, Gyeongsangbuk-Do (KR)

( * ) Notice: Subject to any disclaimer, the term of this patent is extended or adjusted under 35 U.S.C. 154(b) by 266 days.

(21) Appl. No.: 16/492,767

(22) PCT Filed: Mar. 22, 2018

(86) PCT No.: PCT/KR2018/003346
§ 371 (c)(1),
(2) Date: Sep. 10, 2019

(87) PCT Pub. No.: WO2018/190529
PCT Pub. Date: Oct. 18, 2018

(65) Prior Publication Data
US 2021/0063887 A1 Mar. 4, 2021

(30) Foreign Application Priority Data
Apr. 10, 2017 (KR) .......................... 10-2017-0045899

(51) Int. Cl.
G03F 7/32 (2006.01)
G03F 7/20 (2006.01)

(52) U.S. Cl.
CPC ............ *G03F 7/322* (2013.01); *G03F 7/2004* (2013.01)

(58) Field of Classification Search
CPC ................................... G03F 7/32; G03F 7/322
See application file for complete search history.

(56) References Cited

U.S. PATENT DOCUMENTS

| | | | |
|---|---|---|---|
| 3,578,618 A | 5/1971 | Beardsley | |
| 2002/0147300 A1* | 10/2002 | Matsumoto | B41N 3/08 528/422 |
| 2014/0345483 A1* | 11/2014 | Imaizumi | G03F 7/027 101/401.1 |

FOREIGN PATENT DOCUMENTS

| | | | | |
|---|---|---|---|---|
| JP | 62-032453 A | | 2/1987 | |
| JP | 2013-152486 A | | 8/2013 | |
| JP | 2013152486 A | * | 8/2013 | |
| KR | 10-2007-0054234 A | | 5/2007 | |
| KR | 10-1603565 B1 | | 3/2016 | |
| KR | 10-1759571 B1 | | 7/2017 | |
| WO | WO-2012081865 A2 | * | 6/2012 | ............. G03F 7/425 |

* cited by examiner

*Primary Examiner* — John A McPherson
*Assistant Examiner* — Nicholas E Brown
(74) *Attorney, Agent, or Firm* — Novick, Kim & Lee, PLLC; Jae Youn Kim

(57) ABSTRACT

An extreme ultraviolet (EUV) developer composition for use in manufacturing a semiconductor is provided. More particularly an EUV developer composition for forming a fine pattern is provided, which is capable of forming a more uniform pattern and lowering EOP in a development process, the EUV developer composition including a water-soluble polymer represented by Chemical Formula 1, a nonionic surfactant represented by Chemical Formula 2, and an alkali compound.

10 Claims, No Drawings

EUV DEVELOPER COMPOSITION FOR FORMING PHOTOSENSITIVE PHOTORESIST MICROPATTERN

TECHNICAL FIELD

The present invention relates to an extreme ultraviolet (EUV) developer composition for use in manufacturing a semiconductor, and more particularly to a developer composition for forming a fine pattern, which is capable of forming a more uniform pattern and lowering energy of optimum (EOP) in a development process.

BACKGROUND ART

With the recent trend toward miniaturization and integration of semiconductor devices, a fine pattern is required. In the formation of such a fine pattern, increasing the fineness of a photoresist pattern through the development of an exposure device or the introduction of an additional process is regarded as efficient.

During the manufacture of a semiconductor to date, a pattern has conventionally been formed on a semiconductor substrate using an i-line light source at a wavelength of 365 nm, but a light source in a smaller wavelength band is necessary in order to form a finer pattern.

A lithography technique using KrF (248 nm), ArF (198 nm) and EUV (extreme ultraviolet, 13.5 nm) light sources and a double-patterning lithography technique using ArF have been developed and commercialized or are currently being commercialized for real-world application, making it possible to realize a finer wavelength.

In EUV lithography, there is a problem in which the absorption of carbon atoms during exposure upon the formation of a fine pattern is low, so that a pattern is not formed at a desired size or pattern collapse occurs. Without sufficient absorption of carbon atoms in the resist film, it is impossible to form a straight pattern when forming a fine pattern, and sensitivity to EUV may decrease, resulting in insufficient throughput and thus decreased productivity.

In order to increase the efficiency of absorption of carbon atoms, a technique for increasing the carbon density in the resist film has been developed, and increasing the carbon density is effective in improving dry etching resistance and transmittance in the EUV wavelength range. Moreover, a resist underlayer film for EUV lithography is being developed with the goal of realizing a straight pattern.

In order to realize a fine pattern, the aspect ratio of the photoresist pattern is increased, undesirably causing pattern collapse. With regard to pattern collapse, swelling causes the pattern collapse in a development process using a developer, and thus many attempts are being made to develop developers. The generally used developer is an aqueous alkaline developer including tetramethyl ammonium hydroxide (TMAH), which causes pattern collapse due to swelling upon the formation of a fine pattern of 45 nm or less. In order to reduce the swelling of tetramethyl ammonium hydroxide, a developer using tetrabutyl ammonium hydroxide (TBAH) having a longer alkyl group is under study, but is still insufficient for the formation of a pattern of 16 nm or less, and a developer containing benzyl trialkyl ammonium hydroxide has been developed.

Meanwhile, work is being actively made to realize a finer pattern through further research into devising new processes, and it is required to develop a technology that is capable of forming a more uniform pattern and lowering EOP in a development process by rapidly improving the development rate of the photoresist.

DISCLOSURE

Technical Problem

Accordingly, an objective of the present invention is to provide an EUV (extreme ultraviolet) developer composition for use in manufacturing a semiconductor, and more particularly a developer composition for forming a fine pattern, which is capable of forming a more uniform pattern and lowering EOP in a development process.

Technical Solution

Therefore, a first preferred embodiment of the present invention provides a developer composition for forming a fine pattern, including a water-soluble polymer represented by Chemical Formula 1 below, a nonionic surfactant represented by Chemical Formula 2 below, and an alkali compound.

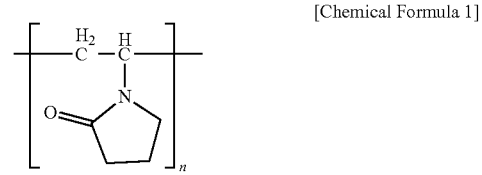

[Chemical Formula 1]

In Chemical Formula 1, n is an integer selected from among 10 to 50.

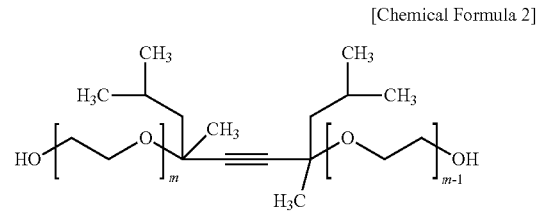

[Chemical Formula 2]

In Chemical Formula 2, m is an integer selected from among 10 to 40.

In a preferred embodiment of the present invention, the alkali compound may be at least one selected from the group consisting of tetraethyl ammonium hydroxide, tetramethyl ammonium hydroxide, tetrabutyl ammonium hydroxide, potassium hydroxide, sodium phosphate, sodium silicate and sodium bicarbonate.

In a preferred embodiment of the present invention, the composition may include, based on the total weight of the composition, 0.1 to 5 wt % of the water-soluble polymer, 0.01 to 5 wt % of the nonionic surfactant, 0.1 to 10 wt % of the alkali compound, and the remainder of deionized water.

Advantageous Effects

According to the present invention, an EUV developer composition for forming a fine pattern is capable of forming a more uniform pattern and lowering EOP in a development process.

BEST MODE

Hereinafter, a detailed description will be given of the present invention.

The present invention pertains to a developer composition for forming a fine pattern, which is capable of forming a more uniform pattern and lowering EOP in a development process during the patterning of an EUV photoresist.

The developer for forming a fine pattern according to the present invention includes a water-soluble polymer represented by Chemical Formula 1 below, a nonionic surfactant represented by Chemical Formula 2 below, and an alkali compound, with the remainder of deionized water.

[Chemical Formula 1]

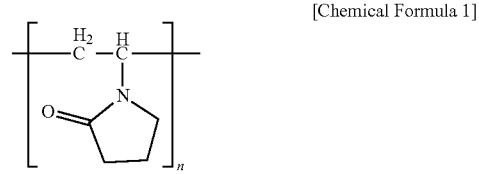

In Chemical Formula 1, n is an integer selected from among 10 to 50.

[Chemical Formula 2]

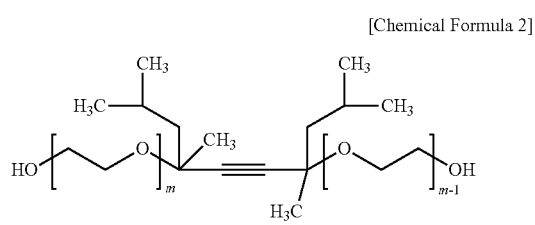

In Chemical Formula 2, m is an integer selected from among 10 to 40.

The composition may include, based on the total weight of the composition, 0.1 to 5 wt % of the water-soluble polymer, 0.01 to 5 wt % of the nonionic surfactant, 0.1 to 10 wt % of the alkali compound, and the remainder of deionized water.

The water-soluble polymer is preferably contained in an amount of 0.1 to 5 wt %, based on the total weight of the composition. If the amount of the water-soluble polymer is less than 0.1 wt %, development residue is likely to form, undesirably deteriorating performance. On the other hand, if the amount thereof exceeds 5 wt %, the development rate may decrease, which is undesirable.

The nonionic surfactant is preferably contained in an amount of 0.01 to 5 wt % based on the total weight of the composition. If the amount of the nonionic surfactant is less than 0.01 wt %, development residue is likely to form. On the other hand, if the amount thereof exceeds 5 wt %, the development rate may rapidly increase, and thus a pattern having a desired shape may not be formed, which is undesirable.

The alkali compound is at least one selected from the group consisting of tetraethyl ammonium hydroxide, tetramethyl ammonium hydroxide, tetrabutyl ammonium hydroxide, potassium hydroxide, sodium hydroxide, sodium phosphate, sodium silicate, sodium carbonate and sodium bicarbonate.

The alkali compound is preferably contained in an amount of 0.1 to 10 wt % based on the total weight of the composition. If the amount of the alkali compound is less than 0.1 wt %, the development process may not be properly performed. On the other hand, if the amount thereof exceeds 10 wt %, the development rate is so fast that there is a risk of pattern collapse, which is undesirable.

In a typical photoresist-patterning process, a photoresist sensitive to EUV is applied through spin coating on a 300 mm silicon wafer at 1500 rpm using a spin coater, dried on a hot plate at 110° C. for 60 sec (SB: soft baking), exposed using an EUV exposure device, dried on a hot plate at 110° C. for 60 sec (PEB: post-exposure baking), and developed for 60 sec with a developer for forming a fine pattern.

In the present invention, the developer for forming a fine pattern is dispensed onto the wafer at 100 rpm at a rate of 22 ml/s for 7 sec, allowed to stand for 20 sec (puddle time), and rinsed with deionized (DI) water, followed by rotating the wafer at 2000 rpm for 20 sec, thereby completing the formation of a photoresist pattern.

The EUV developer composition for forming a fine pattern and the processing method using the composition are capable of forming a more uniform pattern and lowering EOP in the development process, whereby reduced processing time and manufacturing costs may be expected.

MODE FOR INVENTION

A better understanding of the present invention will be given through the following examples and comparative example, in which the examples are set forth merely to illustrate the present invention, but are not to be construed as limiting the scope thereof.

Examples 1 to 20 and Comparative Examples 1 to 7

As shown in Table 1 below, 2 g of a water-soluble polymer of Chemical Formula 1, 1 g of a nonionic surfactant of Chemical Formula 2, and 4 g of tetraethyl ammonium hydroxide as an alkali compound were added with 93 g of deionized (DI) water, subjected to mechanical stirring for 12 hr, and passed through a 0.02 μm filter, thereby preparing a developer composition.

The following treatment process was performed and EOP was confirmed.

A photoresist sensitive to EUV was applied through spin coating on a 300 mm silicon wafer at 1500 rpm using a spin coater, dried on a hot plate at 110° C. for 60 sec (SB: soft baking), exposed using an EUV exposure device, dried on a hot plate at 110° C. for 60 sec (PEB: post-exposure baking), and developed for 60 sec with a developer for forming a fine pattern. Thereafter, the developer for forming a fine pattern was dispensed onto the wafer at 100 rpm at a rate of 22 ml/s for 7 sec, allowed to stand for 20 sec (puddle time), and rinsed with DI water, followed by rotating the wafer at 2000 rpm for 20 sec, thereby completing the formation of a photoresist pattern.

TABLE 1

|  | n in Chemical Formula 1 | m in Chemical Formula 2 |
|---|---|---|
| Example 1 | 10 | 10 |
| Example 2 |  | 20 |
| Example 3 |  | 30 |
| Example 4 |  | 40 |
| Example 5 | 20 | 10 |
| Example 6 |  | 20 |

TABLE 1-continued

|  | n in Chemical Formula 1 | m in Chemical Formula 2 |
| --- | --- | --- |
| Example 7 |  | 30 |
| Example 8 |  | 40 |
| Example 9 | 30 | 10 |
| Example 10 |  | 20 |
| Example 11 |  | 30 |
| Example 12 |  | 40 |
| Example 13 | 40 | 10 |
| Example 14 |  | 20 |
| Example 15 |  | 30 |
| Example 16 |  | 40 |
| Example 17 | 50 | 10 |
| Example 18 |  | 20 |
| Example 19 |  | 30 |
| Example 20 |  | 40 |
| Comparative Example 1 | 5 | 10 |
| Comparative Example 2 |  | 20 |
| Comparative Example 3 |  | 30 |
| Comparative Example 4 |  | 40 |
| Comparative Example 5 | 55 | 10 |
| Comparative Example 6 | 20 | 5 |
| Comparative Example 7 | 20 | 45 |

Comparative Example 8

4 g of tetraethyl ammonium hydroxide was used as the alkali compound, without the use of the water-soluble polymer of Chemical Formula 1 and the nonionic surfactant of Chemical Formula 2 in Example 1, and a wafer was treated in the same manner as in Example 1 and EOP was confirmed.

Comparative Example 9

A developer composition was prepared by adding 1 g of a nonionic surfactant of Chemical Formula 2, in which m is 20, and 4 g of tetraethyl ammonium hydroxide as the alkali compound with 95 g of DI water, without the use of the water-soluble polymer of Chemical Formula 1 in Example 1, followed by mechanical stirring for 12 hr and passing through a 0.02 μm filter, and a wafer was treated in the same manner as in Example 1 and EOP was confirmed.

Comparative Example 10

A developer composition was prepared by adding 2 g of a water-soluble polymer of Chemical Formula 1, in which n is 20, and 4 g of tetraethyl ammonium hydroxide as the alkali compound with 94 g of DI water, without the use of the nonionic surfactant of Chemical Formula 2 in Example 1, followed by mechanical stirring for 12 hr and passing through a 0.02 μm filter, and a wafer was treated in the same manner as in Example 1 and EOP was confirmed.

Test for Measurement of Properties

EOP for a 20 nm line-and-space pattern and limit resolution, which is the minimum dimension of the pattern, in Examples 1 to 20 and Comparative Examples 1 to 10 were measured using CD-SEM (Hitachi S-8820 series). The results are shown in Table 2 below. The lower the EOP ($mJ/cm^2$) and the limit resolution (nm), the more uniform the pattern that can be formed.

TABLE 2

|  | EOP ($mJ/cm^2$) | Limit resolution (nm) |
| --- | --- | --- |
| Example 1 | 11 | 15 |
| Example 2 | 11 | 15 |
| Example 3 | 11 | 16 |
| Example 4 | 11 | 16 |
| Example 5 | 10 | 14 |
| Example 6 | 10 | 14 |
| Example 7 | 10 | 15 |
| Example 8 | 10 | 15 |
| Example 9 | 10 | 14 |
| Example 10 | 10 | 14 |
| Example 11 | 10 | 15 |
| Example 12 | 10 | 15 |
| Example 13 | 11 | 15 |
| Example 14 | 11 | 15 |
| Example 15 | 11 | 16 |
| Example 16 | 11 | 16 |
| Example 17 | 12 | 15 |
| Example 18 | 12 | 15 |
| Example 19 | 12 | 16 |
| Example 20 | 12 | 16 |
| Comparative Example 1 | 19 | 20 |
| Comparative Example 2 | 19 | 20 |
| Comparative Example 3 | 19 | 20 |
| Comparative Example 4 | 19 | 20 |
| Comparative Example 5 | Water-soluble polymer of Chemical Formula 1 was not dissolved | |
| Comparative Example 6 | 19 | 20 |
| Comparative Example 7 | Nonionic surfactant of Chemical Formula 2 was not dissolved | |
| Comparative Example 8 | 19 | 20 |
| Comparative Example 9 | 18 | 19 |
| Comparative Example 10 | 18 | 19 |

Based on the results of measurement of the properties of Table 2, the preferred results are exhibited when n is 10 to 50 in Chemical Formula 1 and m is 10 to 40 in Chemical Formula 2. More preferable results are obtained when n is 20 to 30 in Chemical Formula 1 and m is 10 to 20 in Chemical Formula 2.

The invention claimed is:

1. A developer composition for forming a fine pattern, comprising:
    a water-soluble polymer represented by Chemical Formula 1 below;
    a nonionic surfactant represented by Chemical Formula 2 below; and
    an alkali compound:

[Chemical Formula 1]

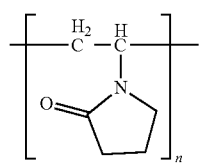

in Chemical Formula 1, n is an integer selected from among 10 to 50; and

[Chemical Formula 2]

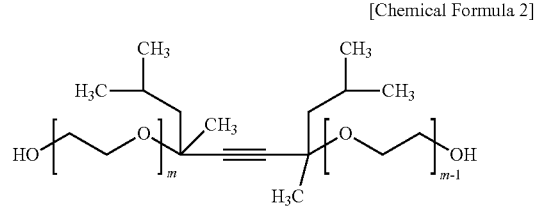

in Chemical Formula 2, m is an integer selected from among 10 to 40.

2. The developer composition of claim 1, wherein in Chemical Formula 1, n is an integer selected from among 20 to 30.

3. A method of forming a fine pattern, the method comprising dispensing the developer composition of claim 2 onto a wafer.

4. The developer composition of claim 1, wherein in Chemical Formula 2, m is an integer selected from among 10 to 20.

5. A method of forming a fine pattern, the method comprising dispensing the developer composition of claim 4 onto a wafer.

6. The developer composition of claim 1, wherein the alkali compound is at least one selected from the group consisting of tetraethyl ammonium hydroxide, tetramethyl ammonium hydroxide, tetrabutyl ammonium hydroxide, potassium hydroxide, sodium phosphate, sodium silicate and sodium bicarbonate.

7. A method of forming a fine pattern, the method comprising dispensing the developer composition of claim 6 onto a wafer.

8. A method of forming a fine pattern, the method comprising dispensing using the developer composition of claim 1 onto a wafer.

9. The developer composition of claim 1, comprising, based on a total weight of the composition, 0.1 to 5 wt % of the water-soluble polymer, 0.01 to 5 wt % of the nonionic surfactant, 0.1 to 10 wt % of the alkali compound and a remainder of deionized water.

10. A method of forming a fine pattern, the method comprising dispensing the developer composition of claim 9 onto a wafter.

* * * * *